United States Patent
Munakata et al.

(10) Patent No.: US 9,391,573 B2
(45) Date of Patent: Jul. 12, 2016

(54) DIGITAL AGC CONTROL METHOD AND FEEDBACK CONTROL APPARATUS

(71) Applicant: TOYO SYSTEM CO., LTD., Iwaki-shi, Fukushima (JP)

(72) Inventors: Ichirou Munakata, Iwaki (JP); Hideki Shoji, Iwaki (JP)

(73) Assignee: TOYO SYSTEM CO., LTD., Iwaki-shi (JP)

( * ) Notice: Subject to any disclaimer, the term of this patent is extended or adjusted under 35 U.S.C. 154(b) by 0 days.

(21) Appl. No.: 14/767,449

(22) PCT Filed: Dec. 26, 2013

(86) PCT No.: PCT/JP2013/085333
§ 371 (c)(1),
(2) Date: Aug. 12, 2015

(87) PCT Pub. No.: WO2014/125753
PCT Pub. Date: Aug. 21, 2014

(65) Prior Publication Data
US 2015/0381127 A1    Dec. 31, 2015

(30) Foreign Application Priority Data
Feb. 15, 2013  (JP) ................... 2013-027392

(51) Int. Cl.
*H04L 27/08* (2006.01)
*H03G 3/00* (2006.01)
(52) U.S. Cl.
CPC ..................................... *H03G 3/002* (2013.01)
(58) Field of Classification Search
CPC ....... H03G 3/002; H03G 7/007; H03G 3/001; H04L 27/3809

USPC ................ 375/345; 330/279, 278; 455/232.1, 455/240.1, 239.1
See application file for complete search history.

(56) References Cited

U.S. PATENT DOCUMENTS

| 6,654,594 | B1 * | 11/2003 | Hughes | ................... | H03G 3/001 |
| | | | | | 375/345 |
| 2002/0118779 | A1 * | 8/2002 | Wu | ..................... | H04L 27/3809 |
| | | | | | 375/345 |

(Continued)

FOREIGN PATENT DOCUMENTS

| JP | 64-54822 A | 3/1989 |
| JP | 04-96477 A | 3/1992 |

(Continued)

OTHER PUBLICATIONS

International Search Report of PCT/JP2013/085333 dated Feb. 4, 2014 [PCT/ISA/210].

*Primary Examiner* — Phuong Phu
(74) *Attorney, Agent, or Firm* — Sughrue Mion, PLLC

(57) ABSTRACT

A digital AGC control method and feedback control apparatus that enable appropriate feedback control in response to reference input values of various magnitudes are provided. The method comprises a first step in which a digital AGC unit 11 outputs a setting value in accordance with a reference input value, a second step in which a PI control unit 12 calculates an operation amount of a controlled object 16 using the setting value, a third step in which a DAC 13 generates an output signal Y representing the operation amount, a fourth step in which a gain regulator 14 and an ADC 15 calculate a measurement value M of the controlled object; and a fifth step in which the measured value M is input to the digital AGC unit 11.

10 Claims, 5 Drawing Sheets

(56) References Cited

U.S. PATENT DOCUMENTS

| | | | | |
|---|---|---|---|---|
| 2003/0227986 A1* | 12/2003 | Filipovic | H04L 27/3809 | 375/345 |
| 2004/0000950 A1* | 1/2004 | Sjursen | H03G 7/007 | 330/279 |
| 2004/0037377 A1* | 2/2004 | Brobston | H04L 27/3809 | 375/345 |
| 2009/0212860 A1* | 8/2009 | Fukuzawa | G01D 3/022 | 330/181 |
| 2010/0057475 A1* | 3/2010 | Sollenberger | G10L 21/00 | 704/500 |

FOREIGN PATENT DOCUMENTS

| | | |
|---|---|---|
| JP | 04-298668 A | 10/1992 |
| JP | 07-282380 A | 10/1995 |
| JP | 11-64194 A | 3/1999 |

* cited by examiner

DIGITAL AGC CONTROL METHOD AND FEEDBACK CONTROL APPARATUS

CROSS REFERENCE TO RELATED APPLICATIONS

This application is a National Stage of International Application No. PCT/JP2013/085333, filed Dec. 26, 2013 (claiming priority based on Japanese Patent Application No. 2013-027392, filed Feb. 15, 2013), the contents of which are incorporated herein by reference in their entirety.

TECHNICAL FIELD

This invention relates to a digital AGC control method utilizing feedback control and a feedback control apparatus.

BACKGROUND ART

When an arbitrary controlled object is feedback-controlled, the general practice is to calculate deviation between a reference input value and a measured value acquired from the controlled object, compute feedback control from this deviation, and control the controlled object using an operation amount obtained by the computation, thereby performing the desired operation.

Feedback control aimed at digitation is performed, for example, by imputing a control target value generated by a signal generator or the like to a deviator. Further, load, displacement or the like sensed by a sensing amplifier is digitally converted and input to the deviator. The deviator computes the deviation between the control target value and the sensed value, a digital control unit performs digital computation based on the deviation concerned under a predetermined gain, and the operation of the controlled object is controlled using the computed control output (see Patent reference 1, for example).

The amplification factor (sensing range) of the aforesaid sensing amplifier is switched by a range switching control unit and the value sensed in the sensing range concerned is output to the deviator. In this apparatus, the switching of the sensing range stabilizes the feedback control and enables high-accuracy execution.

FIG. 1 is an explanatory diagram showing a structure example of an apparatus using conventional feedback control. This apparatus is configured to generate an output signal Y, which is an analog signal, based on a digitized reference input value X, for controlling a controlled object 107. This drawing shows only the portion that performs the feedback control.

The portion that performs the feedback control comprises a range switching unit 101, a deviation calculating unit 102, a control unit 103 that performs PI or PID control, a digital-analogue converter (hereinafter denoted DAC/analog output unit 104, a gain regulator 105, an analog-digital converter (hereinafter denoted ADC) 106, and the controlled object 107.

The range switching unit 101 is provided in advance with a number of input ranges, and upon receiving a reference input value X input from the outside, switches the magnitude of the reference input value X to an appropriate range in accordance with, as a specific example, the number of significant digits representing the value, thereby applying an appropriate gain for enlarging the number of significant digits of the reference input value X.

The reference input value X input to the range switching unit 101 becomes data having a number of significant digits within a prescribed range of the aforesaid input range. The number of significant digits of the data is the same as the number of significant digits of a measured value M output from the ADC 106. The range switching unit 101 outputs the data having the aforesaid number of significant digits as a setting value X'.

When the apparatus starts and firstly receives the setting value X' as input, the deviation calculating unit 102 outputs to the control unit 103 a signal indicating to the effect that the setting value X' does not have a deviation e, or a deviation e of "0" value, and the setting value X'.

The control unit 103 calculates an operation amount for the controlled object 107 corresponding to the setting value X' including the deviation e; for example, an object generates a control signal for PI control or PID control. The input and output signals handled in the range switching unit 101, deviation calculating unit 102 and control unit 103 are digital signals.

Upon receiving the control signal representing the operation amount, the DAC/analog output unit 104 D-A converts the control signal to generate an analog signal that can control the operation of the controlled object 107, or a drive voltage for the controlled object 107, or similar, and outputs the result to the controlled object 107 as the output signal Y. Further, a controlled variable Z is input to the gain regulator 105 which constitutes a feedback path.

The gain regulator 105 converts the signal level of the controlled variable Z to generate an analog signal inputtable to the ADC 106. In other words, the signal level is converted to one suitable for the input dynamic range of the ADC 106.

More specifically, the gain regulator 105 selects from among its own predefined multiple measurement ranges a measurement range that enables input of the controlled variable Z output from the controlled object 107.

Next, the controlled variable Z input at this measurement range is subjected to the amplification (or attenuation) processing defined by that measurement range to convert the controlled variable Z to a signal level inputtable to the ADC 106.

The measurement range switching operation in the gain regulator 105 is performed synchronously with the input range switching at the time the reference input value X is input to the range switching unit 101. The predefined measurement ranges in the gain regulator 105 are, for example, defined to make the measurement range of each range the power of ten.

The ADC 106 A-D converts the analog signal input from the gain regulator 105 to generate the measured value M of prescribed bit length.

After the apparatus goes into operation, the measured value M is sequentially input to the deviation calculating unit 102 together with the setting value X' output from the range switching unit 101, and the deviation e of the input setting value X' at this time is calculated and output to control unit 103.

The control unit 103 uses the input deviation e to perform feedback control computation to generate a control signal indicating a operation amount taking the amount of feedback into account, which it outputs to the DAC/analog output unit 104.

The DAC/analog output unit 104 varies the value of the output signal Y in accordance with the control signal taking the feedback amount input from the control unit 103 into account and outputs this signal to the controlled object 107. The apparatus exemplified in FIG. 1 performs feedback control in this manner.

FIG. 2 is an explanatory diagram showing an operation example of the apparatus utilizing the conventional feedback control. This drawing shows the responsiveness of the ranges switched in the range switching unit 101, and here exemplifies the responsiveness in PI control. In the drawing, the horizontal axis represents elapsed control time and the vertical axis represents percentage of the number of significant digits representing the setting value X' in the input range used in range switching unit 101, for example.

The depicted characteristic curves A(2), B(2) and C(2) represent responsiveness during operation under an input range used when the range switching unit 101 inputs a large reference input value X (input range of small gain), and the characteristic curve D(2) represents the responsiveness during operation under an input range used when a small reference input value X is input (input range of large gain).

Although PID control theoretically rests on the premise that the whole system including the controlled object is linear, an actual system generally includes some portion with non-linear characteristics. For example, the controlled object itself, or when, as is often the case, semiconductor devices are used in the process of operation amount D-A conversion, the input-output characteristics (such as the base voltage-collector current characteristics) of the transistors or other semiconductor devices themselves are essentially non-linear, and since the characteristics during large input therefore differ greatly from the characteristics during small input, the response characteristics frequently vary considerably under the same PI control parameters.

In control processing using an input range corresponding to the aforesaid large value, when the level of the setting value X' or the reference input value X is small in comparison with the characteristic curve A(2) or the characteristic curve B(2), as in the characteristic curve C(2), bit overflow occurs during the calculation of deviation e, the system gain of the apparatus operation including the feedback control diminishes, and the response of the apparatus with respect input slows down.

Thus, during operation under an input range using a large value, the rising characteristic of the apparatus deteriorates with the decrease of the setting value X' or the reference input value X, as indicated by the rising characteristic curve E(2) indicated by a broken line in FIG. 2.

In contrast, in operation under an input range corresponding to a small value, in the case of inputting a reference input value X of a small value similar to the characteristic curve C(s), a large gain is applied that increases the number of significant digits of the setting value X'. As a result, the number of significant digits of the deviation e obtained with respect to the setting value X' also increases.

When an input range corresponding to a small value is used as in the foregoing, the characteristic curve D(2) shown in FIG. 5 is obtained, so that apparatus responsiveness (rising characteristic) becomes better and feedback control convergence becomes faster than in the characteristic curve C(2).

Thus for improving the rising characteristic (control accuracy) and the like in conventional digitized feedback control, it is important to switch to an appropriate input range when inputting the reference input value X.

PRIOR ART REFERENCE

Patent Reference

Patent reference 1: Japanese Unexamined Patent Publication No. H11-064194

SUMMARY OF THE INVENTION

Problem to be Solved by the Invention

As conventional feedback control using a digitized reference input value is performed by processing operations as described in the foregoing, the input value sustains bit overflow unless an appropriate range is selected at the time of inputting the reference input value.

When bit overflow occurs in the reference input value in this way, accurate calculation of deviation using the reference input value and measured value become impossible, so that there has been a problem wherein it is difficult to perform feedback control rapidly with an appropriate operation amount.

This invention was made to solve the aforesaid problem and has as its object to provide a digital AGC control method and feedback control apparatus that enable appropriate feedback control in response to reference input values of various magnitudes.

Means for Solving the Problems

The digital AGC control method according to this invention comprises a first step in which an AGC unit outputs a setting value in accordance with a reference input value, a second step in which a control unit calculates an operation amount of a controlled object using the setting value, a third step in which an output unit generates an output signal representing the operation amount and outputs it to the controlled object, a fourth step in which a measuring unit calculates an operation measurement value of the controlled object, and a fifth step in which the measured value is input to the AGC unit, said first step including a sixth step in which the AGC unit stores the reference input value in a first register, stores the measured value input in the fifth step in a second register, and calculates and stores in a third register a deviation between the reference input value stored in the first register and the measured value, a seventh step in which the number of consecutive bits, other than a sign bit, of "0" value among higher-order bits in the first register is detected, and an eighth step in which the deviation stored in the third register is shifted left by a number of bits in accordance with the number of bits detected in the seventh step to generate a deviation setting value as the setting value.

Further, in the eighth step the number of bits shifted is the same as the number of bits detected.

Further, in the seventh step when the reference input value is a negative number it is converted to a positive number beforehand.

Further, in the eighth step the shifting makes the highest-order bit other than the sign bit of the deviation setting value "0" value after shifting.

Further, in the eighth step the highest-order bit other than the sign bit of the deviation setting is made "0" value by shifting a number of bits one less than the detected number of bits.

Further, in the eighth step the shifting makes the number of significant digits of the deviation setting value greater than 50% and not greater than 100% of the number of bits of the third register.

Effect of the Invention

According to this invention, feedback control responsiveness and operation amount accuracy can be improved by automatic gain control performed by simple bit manipulation.

MODES FOR CARRYING OUT THE INVENTION

In the following, an embodiment of this invention is explained based on the drawings.

Embodiment

Figure 3:
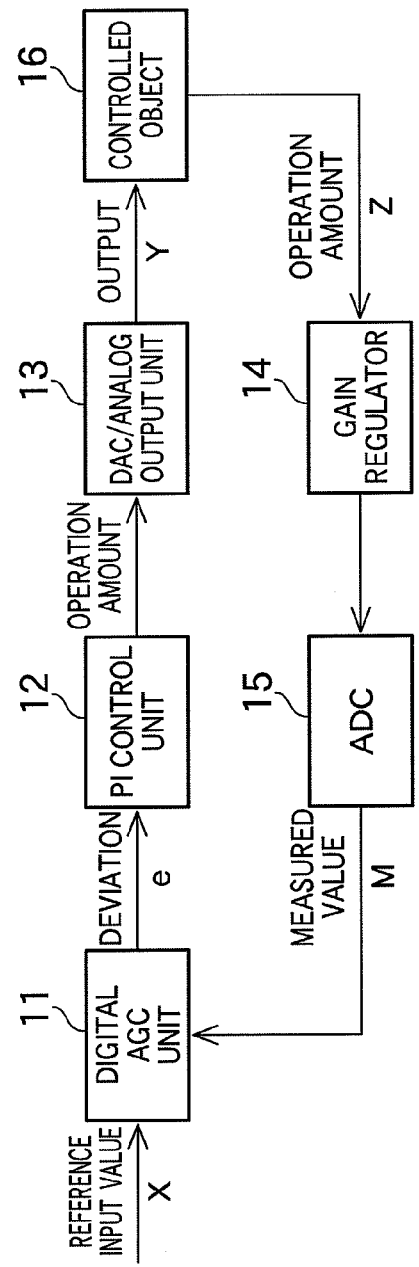
FIG. 3 is an explanatory diagram showing the overall configuration of an apparatus using a digital AGC control method in accordance with an embodiment of this invention.

FIG. 3 is an explanatory diagram showing the overall configuration of an apparatus using a digital AGC control method in accordance with an embodiment of this invention.

This drawing shows an apparatus that receives input of a digitized reference input value X and outputs an output signal Y (analog signal) to a controlled object 16, and is particularly focused on a portion performing feedback control.

The portion performing the feedback control comprises a digital AGC unit 11, a PI control unit 12, a DAC/analog output unit 13, a gain regulator 14, an ADC 15, and a controlled object 16.

The digital AGC unit 11 has a connection configuration to input the digitized reference input value X from the outside and input a measured value M output from the ADC 15.

The PI control unit 12 receives a deviation e output (deviation e2 discussed later) from the digital AGC unit 11 as input and define the operation amount applied to the control object 106, i.e. the PI control unit 12 is configured to generate control data and the like for controlling operation of the controlled object 16.

The PI control unit 12 is not limited to one that performs PI computation and can instead be configured to perform PID control or other such feedback control. A control unit configured to perform PI control is explained here as an example.

The digital AGC unit 11 and PI control unit 12 are equipped with CPUs, DSPs, FPGAs or other processors having registers, and are, for example, configured so that the processors perform processing operations using programs loaded in memory or the like. In other words, the digital AGC unit 11 and PI control unit 12 are configured to comprise, inter alia, input-output means for performing input and output of outside and numerical data and control signals, multiple registers, and control means for controlling the data input-output operations, and shift operations and the like of the registers.

The digital AGC unit 11 and PI control unit 12 can be configured to perform the processing operations using the same processor(s) or be configured to perform the processing operations with separately installed processors.

The DAC/analog output unit 13 has a D-A converter for converting digital data representing the operation amount output from the PI control unit 12 to an analog signal (voltage value) and an analog output unit for generating the output signal Y using the analog signal output from the D-A converter.

The analog output unit is configured to use the output signal of the D-A converter to generate, for example, a control signal of a signal level inputtable to the controlled object 16 and output it as the output signal Y. Alternatively, the analogue output unit is configured to convert the output signal of the D-A converter to a voltage or the like for driving the controlled object 16. In this case, the drive voltage or the like is supplied to the controlled object 16 instead of the aforesaid control signal.

The gain regulator 14 is, for example, configured to appropriately switch among predefined multiple measurement ranges, receive the controlled variable Z from the controlled object 16, and convert (amplify or attenuate) it to an analog signal having a voltage value within a prescribed range inputtable to the ADC 15. The controlled variable Z here is, for example, a drive voltage or the like of the controlled object 16, and is a voltage value (voltage signal) representing the amount of energy supplied to the controlled object 16 or the operating quantity of the controlled object 16.

The ADC 15 is an A-D converter for converting the value of an analog signal to digital data of a prescribed number of bits and has a connection configuration for receiving the analog signal output from the gain regulator 14 and converting it to digital data to generate the measured value M.

The gain regulator 14 and ADC 15 constitute a measuring unit for measuring the magnitude or the like of the controlled variable Z.

The operation will be explained next.

Once the apparatus turns on and first receives the reference input value X as input from outside, the digital AGC unit 11 defines an initial value of the measured value M corresponding to the reference input value X, by default processing, for example, performs processing set out later using this initial value of the measured value M, defines an initial value of the deviation e relative to the reference input value X, and outputs it to the PI control unit 12.

The PI control unit 12 uses the initial value of the deviation e received from the digital AGC unit 11 at this time to calculate an operation amount and outputs a control signal representing this operation amount to the DAC/analog output unit 13.

The DAC/analog output unit 13 generates the output signal Y in accordance with the control signal representing the operation amount and outputs it to the controlled object 16.

As stated above, multiple measurement ranges are defined in the gain regulator 14 beforehand. These measurement ranges are defined, for example, as amplification degrees of the controlled variable Z input from the controlled object 16. Processing for amplifying the input signal levels ×10, ×100, ×1000 and so on is performed at the respective ranges.

The gain regulator 14 uses select means or the like provided therein, for example, to detect the signal level of the controlled variable Z output from the controlled object 16 and select an appropriate measurement range in accordance with the signal level. The controlled variable Z input at the selected measurement range is thereafter converted to an analog signal of a voltage level inputtable to the ADC 15. Alternatively, it is possible for the digital AGC unit 11 to detect the signal level of the reference input value X and input a control signal representing the signal level to the gain regulator 14 for performing the aforesaid measurement range selection in accordance with this control signal.

Upon receiving the analog signal level-converted by the gain regulator 14, the ADC 15 A-D converts the value of the analog signal to generate the measured value M of prescribed bit length and outputs it to the digital AGC unit 11. The measured value M output to the digital AGC unit 11 here is digital data representing the value of the controlled variable Z generated by the controlled object 16, has a bit length that can be stored in a later-explained register (b) of the digital AGC unit 11, and, for example, is represented as a value of a data scale on the order of the reference input value X input to the digital AGC unit 11.

Figure 4:
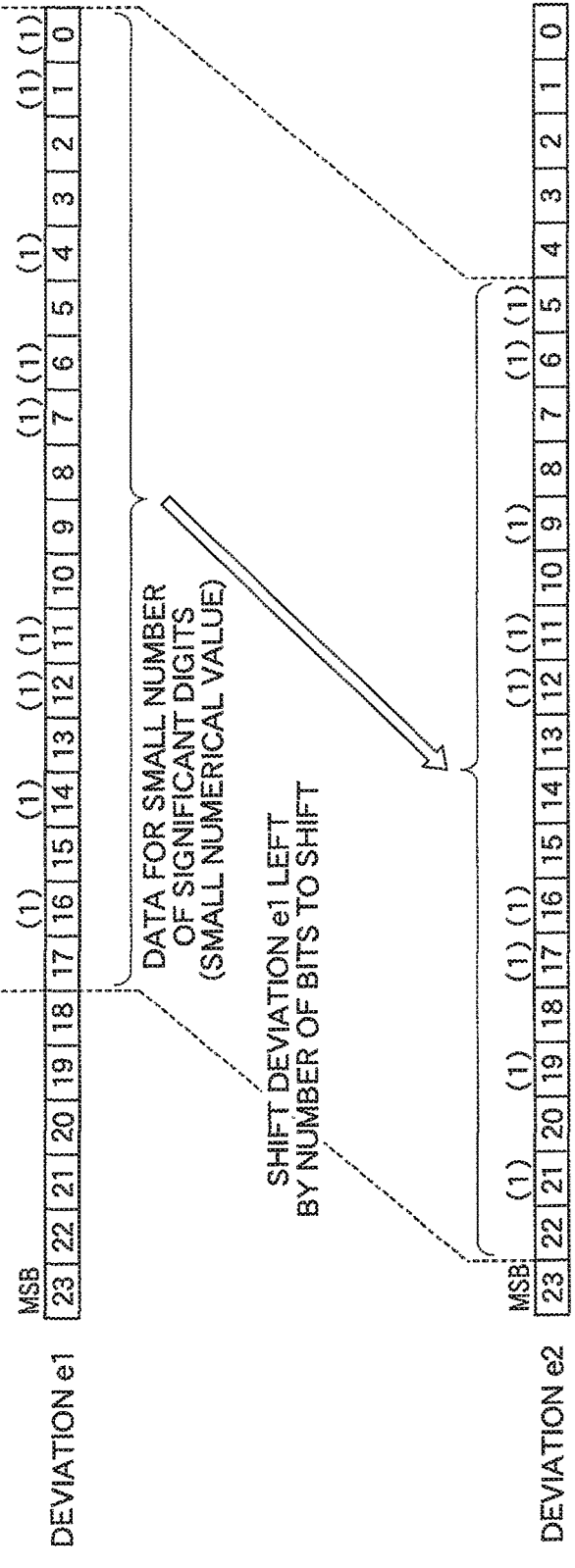
FIGS. 4(a) to 4(c) are a set of explanatory diagrams showing operation of the apparatus using the digital AGC control method in accordance with the embodiment of this invention.

FIG. 4 is a set of explanatory diagrams showing operation of the apparatus using the digital AGC control method in accordance with the embodiment of this invention. This figure shows processing operations performed by the digital AGC unit 11 when the apparatus performs feedback control. The illustrated registers (a) to (c) are provided in the digital AGC unit 11, and manipulation of these registers is performed by control means provided in the digital AGC unit 11.

Upon inputting the reference input value X from outside, the control means of the digital AGC unit 11 stores the value in the register (a). The value stored in the register (a) is maintained until a fresh reference input value X is input from outside.

Further, when the measured value M is input from the ADC 15, this value is stored in the register (b), and deviation e1 (deviation e1 here exemplifies a specific value of the deviation e) between the reference input value X stored in the register (a) and the measured value M stored in the register (b) at this time is calculated and stored in the register (c).

The registers (a), (b) and (c) shown as examples in FIG. 4 are all 24-bit registers and the most significant bit (hereinafter sometimes called MSB) is used as a sign bit. The MSB here is the $23^{rd}$ bit in the drawing.

In the registers shown in the drawing, "1" is stored in the bits marked overhead with (1) and "0" is stored in the unmarked bits. A reference input value X (000001011000101100010010), for example, is stored in the register (a) in FIG. 4.

Further, a measured value M (000000101101100010111111) is stored in the register (b).

Further, the deviation e1 (000000101011100011010011) calculated from the reference input value X and measured value M is stored in the register (c).

When storing desired binary data in a register, a register having a sufficiently larger number of bits than the bit data to be stored is generally used. When the binary-coded reference input value X is stored in the register (a), a section storing "0" occurs on the MSB side (high-order side) of the register (a).

The control means of the digital AGC unit 11 detects the number of consecutive "0" value bits stored in higher-order bits in the register (a) storing the reference input value X. Specifically, the number of consecutive bits storing "0" beginning from the bit adjacent to the MSB of the register (a) ($22^{nd}$ bit) and moving toward the lower-order side is detected.

In the processing operation exemplified in FIG. 4, "0" is stored in the register (a) at five consecutive bit adjacent to the MSB, namely, from the $22^{nd}$ bit to the $18^{th}$ bit.

The control means of the digital AGC unit 11 takes the detected number of bits as the number of bits to shift and shifts the bit pattern in the register (c) left five bit, e.g., moves the data stored in the $17^{th}$ bit to the $22^{nd}$ bit. The data stored in the register (c) after the shift is designated deviation e2 (deviation setting value).

When performing the register (c) shift operation in accordance with the number of bits to shift acquired from the register (a) by the aforesaid detection processing, the number of bits to shift (shift length) is preferably adjusted so that the highest-order bit excluding the sign bit of the deviation e2 ($22^{nd}$ bit) becomes "0". Specifically, the shift length is made one bit less than the number of bits (number of bits to shift) detected from the register (a). Thus the shift length of the deviation e1 is shortened in accordance with the situation so as to make the highest-order bit exclusive of the MSB after shifting ($22^{nd}$ bit) "0", thereby preventing overflow of the feedback control owing to the deviation e2 becoming larger than the reference input value X.

In the processing operation exemplified in FIG. 4, when the shift operation of the register (c) is performed using the number of bit to shift detected from the register (a) storing the reference input value X, the highest-order bit exclusive of the sign bit of the deviation e2 after shifting is "0". Therefore, the aforesaid adjustment of the number of bits to shift is not performed in the illustrated processing operation.

Further, when the received reference input value X is negative, the control means of the digital AGC unit 11 calculates the absolute value of the reference input value X, whereafter it detects the number of consecutive "0" value bits in the foregoing manner, similarly calculates the deviation e1, and performs the aforesaid shift operation. In other words, when the reference input value X is negative, it is converted to a positive value beforehand, and the number of bits to shift is detected thereafter.

More specifically, when a negative value is expressed by two's complement expression, the register is entirely filled with "1" bit values from the sign at the highest-order of the significant figure. Therefore, when the reference input value X is a negative value, the absolute value or bit inversion of the reference input value X is taken beforehand and the detection of the aforesaid number of bits to shift is performed after the higher-order invalid bits are replaced with "0". Also in this case, the deviation e1 is the difference between the reference input value X having the sign when input to the digital AGC unit 11 and the measured value M.

As explained in the foregoing, the bit pattern of the deviation e1 is shifted left, whereby the significant part of the deviation e1 is moved to the higher-order bit of the register (c) and the deviation e2 becomes a larger value than the deviation e1.

More specifically, shifting the content of the register (c) or the like left one bit amounts to multiplying the original binary data by $2^1$ times and shifting it left two bits amounts to multiplying it by $2^2$ times. When the deviation e1 is shifted left five bits as discussed above, the value of the deviation e2 becomes $2^5$ times i.e., 64 times, that of the deviation e1.

When the reference input value X becomes one-half value, for example, the number of "0" value bit on the high-order side of the register (a) increases by one in the foregoing manner. When this one bit increase in the number of "0" value bit is detected and the corresponding number of bits is shifted left in the register (c), the deviation e2 produced by the shift operation becomes the value of the deviation e1 times two.

Thus, when the reference input value X becomes one-half, the shift length of the deviation e1 increases by one bit. Further, the left shift by one bit makes the value in the register (c) e1×2. In other words, the shift length is greater when the reference input value X is small and the shift length is smaller when the reference input value X is large.

Further, since the deviation e1 increases by powers of two with increasing shift length (number of bits shifted left), the deviation e2 whose value is defined by the shift length becomes the value of deviation e1 multiplied by a larger multiplying factor when the reference input value X is small. Further, when the reference input value X is large, the deviation e2 becomes the value of deviation e1 multiplied by a small multiplying factor. Namely, the aforesaid shift operation performs automatic gain regulation of the reference input value X. In other words, after the shifting operation, a deviation e1 of any value whatever comes to have its significant part stored in the high-order bit, and the deviation e2 representing the deviation between the reference input value X and the measured value M can be obtained without bit overflow.

When the PI control unit 12 receives the deviation e2 multiplied as mentioned above, it performs proportional-integral (PI) computation using the deviation e2 to calculate an operation amount taking the feedback amount into account.

Upon receiving the operation amount taking feedback amount into account, the DAC/analog output unit 13 generates the output signal Y representing the operation amount and outputs it to the controlled object 16. Further, the controlled variable Z generated by the controlled object 16 is input to the gain regulator 14 and the analog signal level-converted in the foregoing manner is output to the ADC 15.

The ADC 15 A-D converts the analog signal received from the DAC/analog output unit 13, generates the measured value M of the controlled variable Z, and outputs it to the digital AGC unit 11. The feedback control is thereafter repeated to converge the deviation e1 or deviation e2 to 0 and send an output signal Y representing an appropriate operation amount to the controlled object 16.

When the feedback control is repeated the aforesaid manner, specifically in the case where the reference input value X input to the digital AGC unit 11 maintains a fixed value for a period of, for example, several [ms] or more, the sampling of the controlled variable Z generated by the controlled object 16 during the fixed-value period is conducted at intervals of about 10 to 100 [μs], i.e., the ADC 15 is made to output the measured value M at the aforesaid interval rate and feedback control is performed at every sampling time. The repetition of the feedback control in this manner works to diminish the deviation e1 or deviation e2 and converge the operation amount with respect to the reference input value X to a favorable value.

Figure 5:
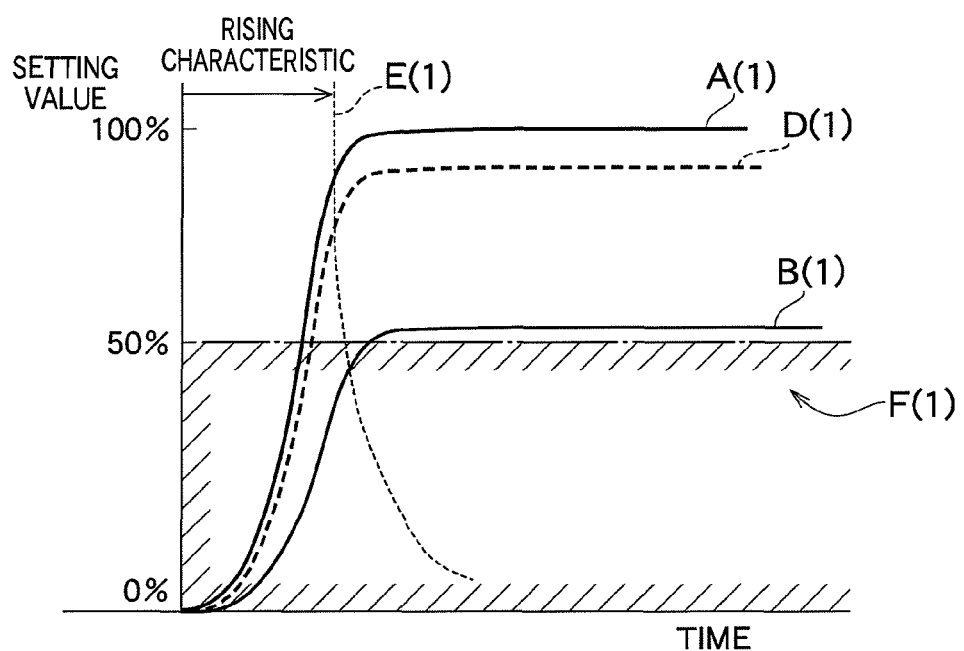
FIG. 5 is an explanatory diagram showing operation characteristics of the apparatus using the digital AGC control method in accordance with the embodiment of this invention.

FIG. 5 is an explanatory diagram showing operation characteristics of the apparatus using the digital AGC control method in accordance with the embodiment of this invention. This drawing shows how the value in the register (c) progresses with repeated sampling of the controlled variable Z when the feedback control is performed in the apparatus shown in FIG. 3.

Here, the vertical axis in FIG. 5 represents the proportion accounted for by the number of bits (number of significant digits) of the portion representing the value of the deviation e2 in the register (c) after the shift operation, where the maximum value storable in the register (c) is defined as 100%. In FIG. 5, deviation e2 is represented as the setting value.

Further, the horizontal axis in FIG. 5 represents passage of time during execution of feedback control by repeating sampling of the controlled variable Z.

The characteristic curves A(1) and B(1) in the diagram are for cases where the shift length of the register (c) is relatively small, and the characteristic curve D(1) is for a case where the shift length is relatively large.

Figure 1:
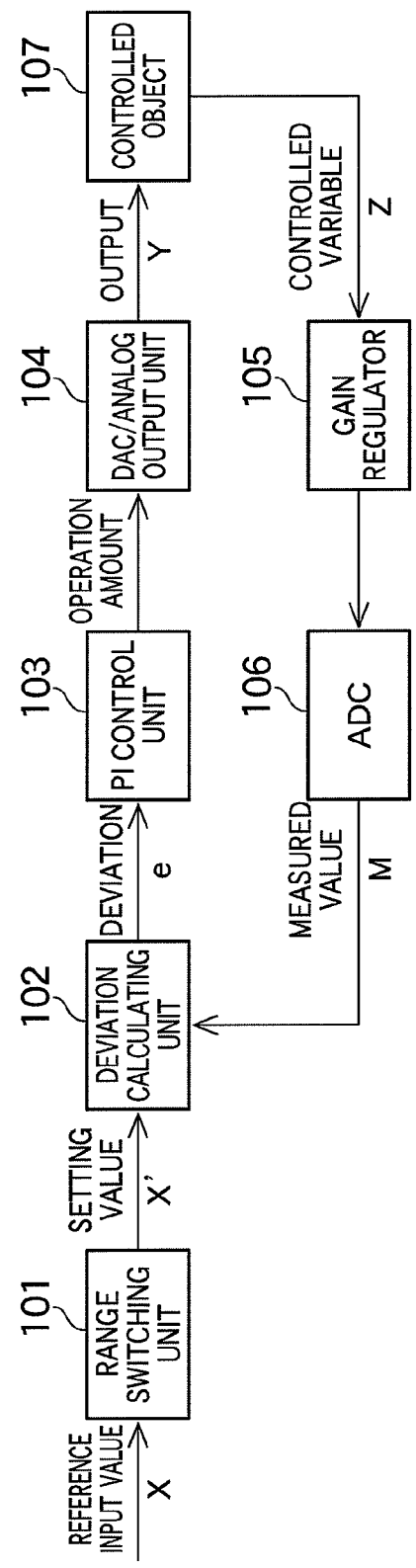
FIG. 1 is an explanatory diagram showing a structure example of an apparatus using conventional feedback control.
Figure 2:
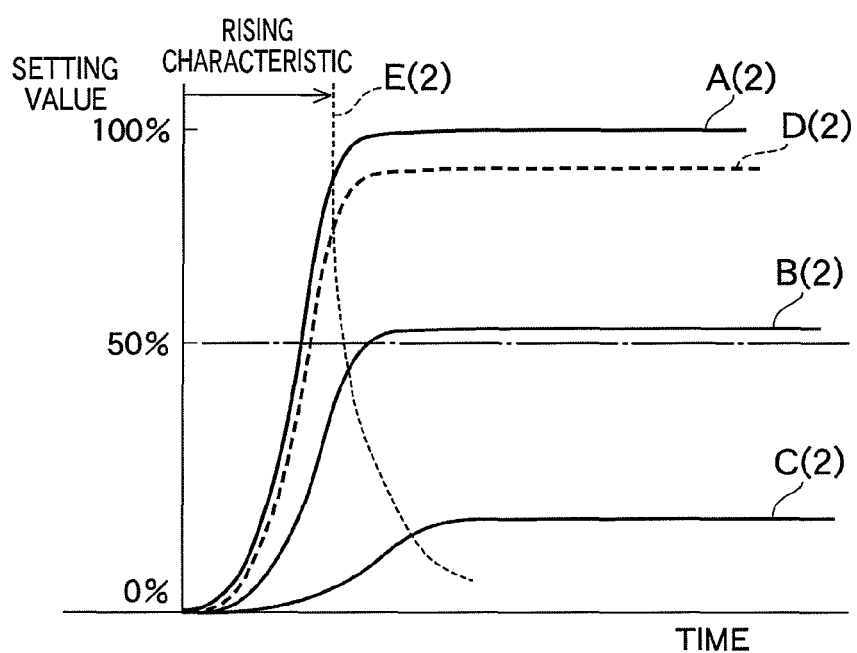
FIG. 2 is an explanatory diagram showing an operation example of the apparatus utilizing the conventional feedback control.

The cases where the shift lengths are relatively small correspond to the cases shown in FIG. 2 of operation under an input range using a large value (input range of small gain), and the case where the shift length is relatively large corresponds to the case shown in FIG. 2 of operation under an input range using a small value (input range of large gain).

The characteristic curve A(1) represents the responsiveness when feedback control was performed with a reference input value X of large value stored in the register (a).

When the reference input value X input to the digital AGC unit 11 is a large value like this, the number of significant digits when stored in the register (a) is also large.

When the digital AGC unit 11 calculates the deviation e1 with respect to the large reference input value X and performs the register (c) shift operation, the shift length is small, but the number of significant digits of the deviation e2 generated by the shift operation is large. In other words, the amplification degree of the gain regulation by the digital AGC unit 11 is small, but the value defined as the deviation e2 is large, so that the loop gain in the feedback control is large and the operation amount calculated by the PI control unit 12 rapidly converges when the feedback control is repeated. That is, the deviation e2 quickly becomes a constant value and a favorable rising characteristic is obtained in this case.

The characteristic curve B(1) represents the responsiveness in the case of storing a medium magnitude reference input value X in the register (a) and performing feedback control.

The above responsiveness is for the case where the reference input value X input to the digital AGC unit 11 was of medium value and the number of significant digits when this was stored in the register (a) was medium sized, e.g., somewhat larger than 50%.

When the control means of the digital AGC unit 11 calculates the deviation e1 with respect to the medium-sized reference input value X and performs the register (c) shift operation, then in the case where, for example, a deviation e2 is generated by a shift length equal to or about the same size as that in the case of the large reference input value X that gave the characteristic curve A(1), the number of significant digits of this deviation e2 is somewhat greater than 50% of the number of bits of the register (c), or even larger. When the deviation e2 thus has a number of significant digits larger than 50%, a rising characteristic is obtained that, while inferior to the case where the characteristic curve A(1) is obtained, is nevertheless adequately fast in feedback control.

When the digital AGC unit 1 receives a reference input value X of small value and performs a shift operation of the register (c) with a small shift length, the number of significant digits of the generated deviation e2 is small and may sometimes be 50% or less of the number of bits of the register (c).

When the number of significant digits of the deviation e2 is 50% or less of the number of bits of the register (c), the time required for the deviation e2 to converge to 0 becomes long and the rising characteristic deteriorates.

As explained above, the digital AGC unit 11 decides the shift length of the register (c) in accordance with the magnitude of the reference input value X (number of bits detected from the register (a)) and generates the deviation e2 so that its aforesaid number of significant digits is greater than 50% and not greater than 100% of the number of bits of the register (c). The deviation e2 is not defined in the region F(1) fallen in 50% or less number of significant digits in FIG. 5.

In the light of the foregoing, it is, for example, also possible when the number of significant digits of the deviation e1 stored in the register (c) is larger than 50% of the number of bits of the register (c) to perform the PI computation and the like using the deviation e1 as it is, without performing the shift operation.

Specifically, in this case the control means of the digital AGC unit 11 detects the number of significant digits of the deviation e1 stored in the register (c) and determines as to whether it is 50% or less of the number of bits of the register (c). When the number of significant digits is found to be larger than 50%, the deviation e1 is output to the PI control unit 12 and used for feedback control computation as stated above. Further, when it is found to be 50% or less, the number of consecutive bits, other than a sign bit, of "0" value among higher-order bits in the register (a) storing the reference input value X is detected, a deviation e2 having an appropriate gain owing to the aforesaid shift operation is calculated, and this is output to the PI control unit 12 and used for feedback control computation.

By performing the shift operation so as to make the number of significant digits of the deviation e2 greater than 50% and 100% or less of the number of bits of the register (c) and using it in the feedback control computation in the foregoing manner, the feedback control can be performed in a region where the rising characteristic curve E(1) shown by a broken line in FIG. 5 is approximately a straight line. In other words, the responsiveness of the feedback control can be improved irrespective of the magnitude of the reference input value X.

The characteristic curve D(1) shown by a broken line in FIG. 5 indicates a case in which upon receiving a small reference input value X, the digital AGC unit 11 performed a shift operation to establish a large gain and define a deviation e2 with a large number of significant digits.

When a reference input value X of small value is input, the control means of the digital AGC unit 11 regulates the gain at the time of defining the deviation e2 by performing a shift operation of the register (c) at a shift length of, for example, the same number of bits as the number of bits detected from the register (a). In other words, owing to this gain regulation, a deviation e2 is defined in the register (c) to become a high ratio of significant digits. That is, when a small reference input value X is input, the shift length of the deviation e1 is increased to define a deviation e2 applied with a large gain, thereby achieving responsiveness comparable to that in system control based on a large reference input value X.

As set out above, this embodiment is configured to detect the number of consecutive bits, other than a sign bit, of "0" value among higher-order bits in the register (a) storing the reference input value X, calculate and store in the register (c) the deviation e1 between the reference input value X and the measured value M, calculate the deviation e2 by left-shifting the register (c) a number of bits in accordance the detected number of bits, and use the deviation e2 to perform feedback control computation, thereby making it possible to perform gain regulation in accordance with the magnitude of the reference input value X by simple bit manipulation and to improve the responsiveness of the feedback control in response to reference input values of various magnitudes.

Moreover, since the aforesaid bit manipulation increases gain by the power of 2 with each 1-bit shift to the left, the operation amount of the controlled object 16 can be more finely defined than in feedback control performing conventional input range switching. Still further, steep change of the deviation e2 can be restrained when feedback control is performed with repeated sampling, so that the operation amount can be smoothly varied.

REFERENCE SIGN LIST

11 DIGITAL AGC UNIT
12 PI CONTROL UNIT
13, 104 DAC/ANALOG OUTPUT UNIT
14, 105 GAIN REGULATOR
15, 106 ADC
16, 107 CONTROLLED OBJECT
101 RANGE SWITCHING UNIT
102 DEVIATION CALCULATING UNIT
103 CONTROL UNIT

The invention claimed is:

1. A digital AGC control method comprising:
a first step in which an AGC unit outputs a setting value in accordance with a reference input value;
a second step in which a control unit calculates an operation amount of a controlled object using the setting value;
a third step in which an output unit generates an output signal representing the operation amount and outputs it to the controlled object;
a fourth step in which a measuring unit calculates an operation measurement value of the controlled object; and
a fifth step in which the measured value is input to the AGC unit,
said first step including:
a sixth step in which the AGC unit stores the reference input value in a first register, stores the measured value input in the fifth step in a second register, and calculates and stores in a third register a deviation between the reference input value stored in the first register and the measured value;
a seventh step in which a number of consecutive bits, other than a sign bit, of "0" value among higher-order bits in the first register is detected; and
an eighth step in which the deviation stored in the third register is shifted left by a number of bits in accordance with the number of bits detected in the seventh step to generate a deviation setting value as the setting value.

2. The digital AGC control method set out in claim 1, wherein in the eighth step the number of bits shifted is the same as the number of bits detected.

3. The digital AGC control method set out in claim 1, wherein in the seventh step when the reference input value is a negative number, the reference input value is converted to a positive number beforehand.

4. The digital AGC control method set out in claim 1 wherein in the eighth step the shift is performed to make the value of the highest-order bit other than the sign bit "0".

5. The digital AGC control method set out in claim 1 wherein in the eighth step, the highest-order bit other than the sign bit of the deviation setting is made "0" value by shifting a number of bits one less than the detected number of bits.

6. The digital AGC control method set out in claim 1 wherein in the eighth step the shifting makes the number of significant digits of the deviation setting value greater than 50% and not greater than 100% of a number of bits of the third register.

7. The digital AGC control method set out in claim 2 wherein in the eighth step the shifting makes the number of significant digits of the deviation setting value greater than 50% and not greater than 100% of a number of bits of the third register.

8. The digital AGC control method set out in claim 3 wherein in the eighth step the shifting makes the number of significant digits of the deviation setting value greater than 50% and not greater than 100% of a number of bits of the third register.

9. The digital AGC control method set out in claim 4 wherein in the eighth step the shifting makes the number of significant digits of the deviation setting value greater than 50% and not greater than 100% of a number of bits of the third register.

10. The digital AGC control method set out in claim 5 wherein in the eighth step the shifting makes the number of significant digits of the deviation setting value greater than 50% and not greater than 100% of a number of bits of the third register.

* * * * *